(12) United States Patent
Unno et al.

(10) Patent No.: US 6,641,985 B2
(45) Date of Patent: Nov. 4, 2003

(54) METHOD FOR MAKING ELEMENT

(75) Inventors: Yasuyuki Unno, Minamikawachi-machi (JP); Ichiro Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/427,743

(22) Filed: Oct. 27, 1999

(65) Prior Publication Data

US 2003/0064295 A1 Apr. 3, 2003

(30) Foreign Application Priority Data

Oct. 29, 1998 (JP) .......................................... 10-324524
Oct. 22, 1999 (JP) .......................................... 11-301709

(51) Int. Cl.⁷ .............................. G03C 5/00; G02B 5/18
(52) U.S. Cl. .................... 430/321; 430/324; 359/563; 359/570; 359/576
(58) Field of Search ................................ 430/321, 322, 430/323, 394, 5, 30, 324; 359/575, 569, 565, 566, 571, 580, 573, 563, 570, 576

(56) References Cited

U.S. PATENT DOCUMENTS

| | | | | | |
|---|---|---|---|---|---|
| 4,895,790 A | * | 1/1990 | Swanson et al. | ............. | 430/321 |
| 5,218,471 A | * | 6/1993 | Swanson et al. | ............. | 359/565 |
| 5,407,785 A | * | 4/1995 | Leroux | ....................... | 430/312 |
| 5,589,305 A | * | 12/1996 | Tomofuji et al. | ............... | 430/5 |
| 5,795,684 A | * | 8/1998 | Troccolo | ........................ | 430/5 |
| 5,995,285 A | * | 11/1999 | Unno | ......................... | 359/565 |
| 6,120,950 A | * | 9/2000 | Unno | ......................... | 430/30 |
| 6,122,104 A | * | 9/2000 | Nakai | ......................... | 359/576 |

* cited by examiner

Primary Examiner—Christopher G. Young
Assistant Examiner—Saleha R. Mohamedulla
(74) Attorney, Agent, or Firm—Fitzpatrick, Cella, Harper & Scinto (57) ABSTRACT

A $SiO_2$ thin film is formed on a $SiO_2$ substrate provided with a binary-type diffractive element by a radiofrequency sputtering process so as to cover the fine irregularities formed on the substrate caused by misalignment of masks in the production process. This film planarizes the surface having the fine irregularities and thus prevents a decrease in diffraction efficiency.

17 Claims, 7 Drawing Sheets

METHOD FOR MAKING ELEMENT

BACKGROUND OF THE INVENTION

1. Field of the Invention

The present invention relates to methods for making elements having microirregularities. In particular, the present invention relates to a method for making an optical element capable of correcting the shape of a diffraction grating to improve for low diffraction efficiency of the diffraction lattice which is caused by production errors, such as misalignment of masks.

2. Description of the Related Art

Since a combination of diffraction gratings and refracting elements has some advantages, for example, correction of chromatic aberrations and lightweight optical systems, it has been intensively studied for practical use in various fields. In typical methods for making diffractive optical elements in recent years, a blazed pattern on the surfaces of diffractive optical elements is replaced with an approximated multilevel pattern, and the elements are produced using lithographic processes used in the production of semiconductor devices. These methods facilitate the precise production of fine-pitch configurations, and have been applied to commercial production in a variety of applications.

Diffractive optical elements having multilevel surfaces are referred to as binary-type diffractive optical elements. An ideal blazed element has a diffraction efficiency of 100%, whereas an approximated multilevel element having N levels or steps has a diffraction efficiency represented by equation (1):

$$\{\sin(\pi/N)/(\pi/N)\}^2 \times 100(\%) \qquad (1)$$

For example, when N=8 in equation (1), the efficiency is 95%, which is a sufficiently practical level for ordinary optical systems. A higher diffraction efficiency, for example, 99% or more, is achieved by increasing the number of levels to 16.

FIGS. 5(1) to 5(12) are cross-sectional views of a conventional method for making a diffractive optical element. In general, to form $2^N$ levels, some steps are repeated N times using N masks, and in FIG. 5, a diffractive element having a pitch P of 8 (eight levels) is produced by using three masks. FIGS. 5(1) to 5(4) are steps for forming a two-level repeating unit using a first mask 3, FIGS. 5(5) to 5(8) are steps for forming a four-level repeating unit using a second mask 5, and FIGS. 5(9) to 5(12) are steps for forming an eight-level repeating unit using a third mask 7.

With reference to FIG. 5(1), a positive-type resist 2 is applied to a transparent glass substrate 1 having a refractive index n, and the pattern of the first mask 3 is transferred onto the resist 2 by exposure light L. The pattern of the first mask 3 has a pitch P, and the width of both the shading section and the open section is P/2. Next, the resist 2 is developed in FIG. 5(2) and the glass substrate 1 is etched in FIG. 5(3). The residual resist is removed to form a two-level repeating unit, as shown in FIG. 5(4). The required etched depth d1 is represented by the equation (2):

$$d1=(\lambda/2)/(n-1) \qquad (2)$$

wherein $\lambda$ is the operating wavelength.

Next, a resist 4 is applied to the glass substrate with the two-level repeating unit and is exposed using the second mask 5, as shown in FIG. 5(5). The pattern pitch of the second mask 5 is half of the pattern pitch of the first mask 3, and the shading section and the open section both have a width of p/4. For exposure, the pattern edge is exactly aligned to the edge of the two-level configuration. With reference to FIG. 5(6), a resist pattern is formed after development. With reference to FIG. 5(7), the glass substrate is etched by a second etching process and the residual resist is removed. As shown in FIG. 5(8), a four-level repeating unit is formed on the glass substrate. The etched depth d2 by the second etching process is represented by equation (3):

$$d2=(\lambda/4)/(n-1) \qquad (3)$$

Finally, an eight-level repeating unit is formed. A resist 6 is applied to the substrate having the four-level surface and is exposed through the third mask 7, as shown in FIG. 5(9). The pattern pitch of the third mask 7 is half of the pattern pitch of the second mask 5, and the shading section and the open section both have a width of P/8. For exposure, the pattern edge is exactly aligned to the edge of the four-level configuration. With reference to FIG. 5(10), a resist pattern is formed after development. With reference to FIG. 5(11), the glass substrate is etched by a third etching process and the residual resist is removed. As shown in FIG. 5(11), an eight-level repeating unit is formed on the glass substrate. The etched depth d3 by the third etching process is represented by equation (4):

$$d3=(\lambda/8)/(n-1) \qquad (4)$$

An eight-level repeating unit having a pitch of P and a height per step of d3 is thereby produced, as shown in FIG. 5(12).

Figure 6:
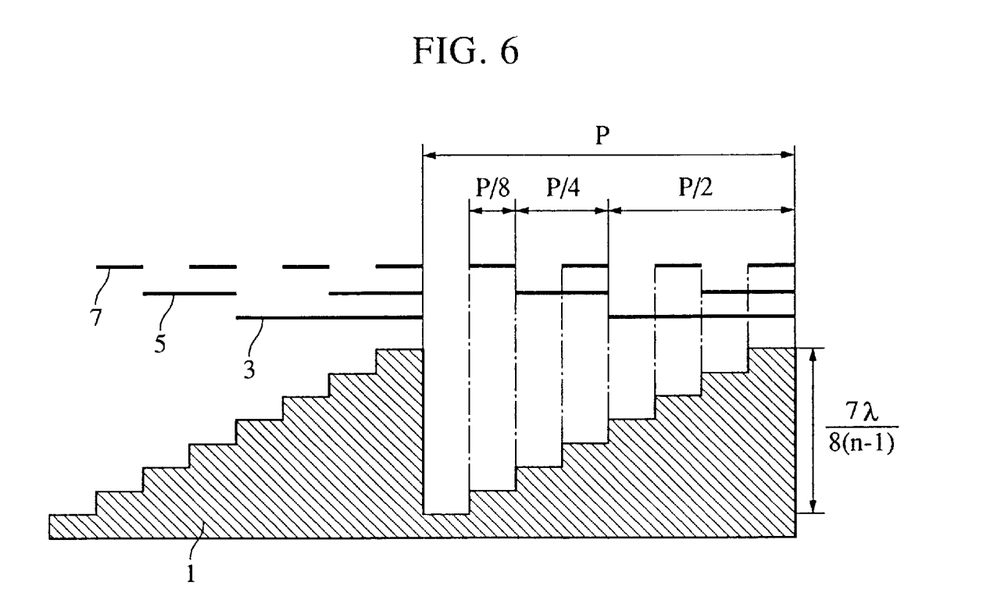
FIG. 6 is a cross-sectional view of a surface profile of an element and three masks.

FIG. 6 shows the relationship between the three masks 3, 5 and 7 and the relative positions in the final eight-level repeating units. The difference between the highest level and the lowest level is $(7\lambda/8)/(n-1)$ and the height per level is $(\lambda/8)/(n-1)$.

In this case, the maximum diffraction efficiency for primary diffracted light is 95%. When quartz ($SiO_2$) with a refractive index n of 1.51 is used as the substrate, the height per level is 61 nm for $\lambda$=248 nm.

However, an eight-level binary diffractive element has a diffraction efficiency of 95% only when Fresnel reflection between air and the substrate neglected. The theoretical diffraction efficiency of the eight-level element becomes approximately 91% when the optical loss due to the Fresnel reflection at the boundary is taken into account.

In the above conventional method, however, misalignment between the plurality of masks causes problems. In FIG. 6, if misalignment does not occur between the three masks 3, 5 and 7, ideal eight-level repeating units are formed. It is, however, difficult to avoid misalignment between the masks 3, 5 and 7 in actual production processes, and thus such misalignment will inevitably occur.

Figure 7:
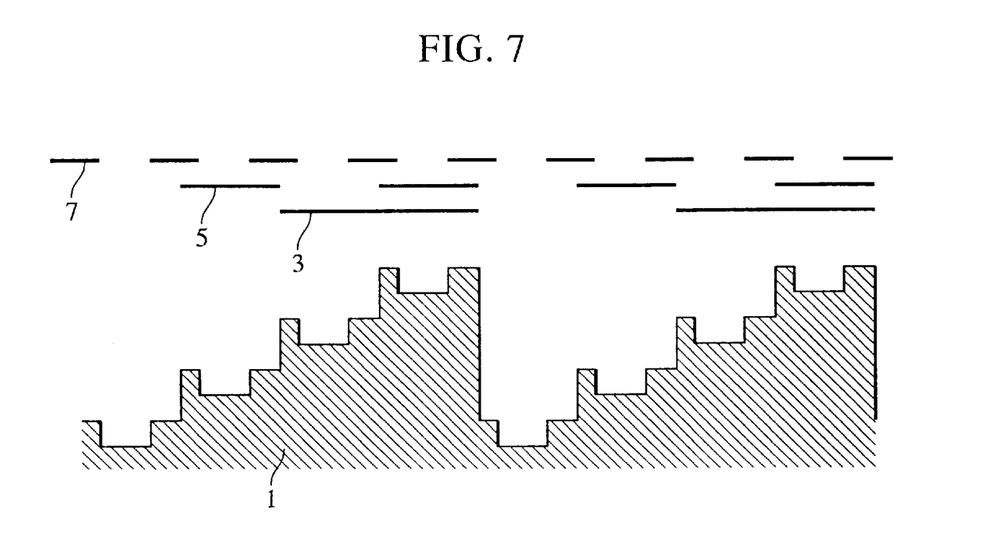
FIG. 7 is a cross-sectional view showing misalignment of masks.

FIG. 7 is an exemplary surface shape of an element when misalignment occurs between the three masks 3, 5 and 7, in which the first mask 3 and the second mask 5 are exactly aligned, but the third mask 7 is misaligned. The surface profile changes by such misalignment between these masks 3, 5 and 7, and generally has a complicated pattern having microirregularities rather than an ideal eight-level pattern.

Figure 8:
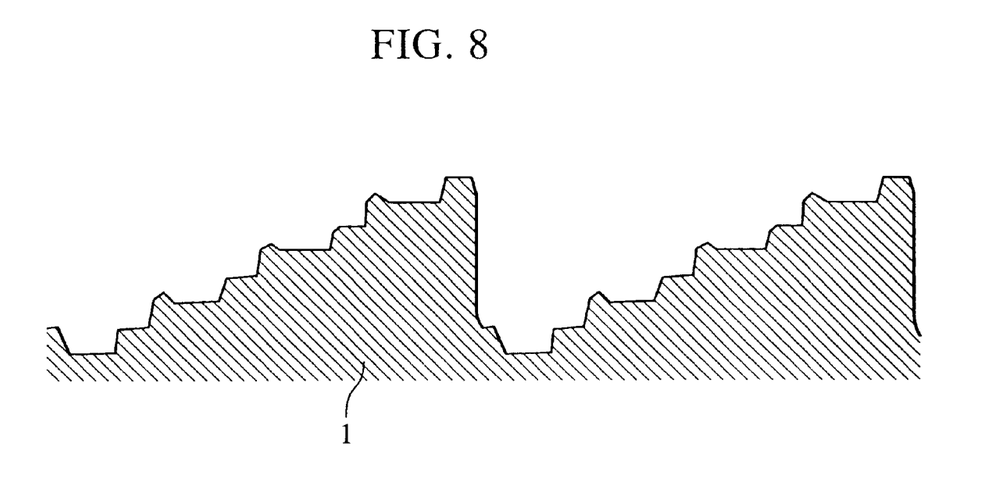
FIG. 8 is a cross-sectional view showing a surface profile of an element.

The surface profile shown in FIG. 7 is obtained by calculation under the assumption that the substrate is ideally etched only in the vertical direction. The narrow protruding sections, however, also are etched during the etching process. In addition, the etching rate is not uniform over the entire substrate. As a result, for example, a diffractive element having a pitch P of 5.0 $\mu$m has a surface profile as shown in FIG. 8, according to scanning electron microscopy. The diffraction efficiency of this element is at most 79%, which is significantly lower than the ideal value of 91%.

SUMMARY OF THE INVENTION

It is an object of the present invention to provide a method for making an optical element without misalignment of masks which results in a decrease in diffraction efficiency.

According to a first aspect of the present invention, a method for making an element includes forming an irregular pattern on a substrate, and forming a film for correcting errors in the irregular pattern.

Preferably, at least one antireflective film having a different refractive index from that of the substrate is formed.

According to a second aspect of the present invention, a method for making an optical element includes forming a multilevel pattern on a substrate by a lithographic process, and forming a film having a refractive index which is the same as that of the multilevel pattern.

The lithographic process preferably includes one of an etching process and a deposition process.

According to a third aspect of the present invention, a method for making an optical element comprises repeating a plurality of times a series of steps including a step of applying a resist to a substrate, a pattern transfer step, an etching step and a resist removal step to form a multilevel element pattern on the substrate; and forming a film having a refractive index which is the same as that of the multilevel element pattern.

According to a fourth aspect of the present invention, a binary-type diffractive optical element is produced by any one of the above-described methods.

Preferably, the film has a thickness which is one half to three-quarters the height of a level in a diffraction grating constituting the binary-type diffractive optical element.

According to a fifth aspect of the present invention, an optical system includes a diffractive optical element produced by one of the above-described methods.

According to a sixth aspect of the present invention, an exposure apparatus includes the above-described optical system.

According to a seventh aspect of the present invention, a method for making a device includes transferring a circuit pattern onto a wafer using the above-described exposure apparatus.

Further objects, features and advantages of the present invention will become apparent from the following description of the preferred embodiments with reference to the attached drawings.

BRIEF DESCRIPTION OF THE DRAWINGS

FIGS. 5(1) to 5(12) are cross-sectional views of steps in a method for making a conventional eight-level binary element;

DESCRIPTION OF THE PREFERRED EMBODIMENT

The present invention will now be described in detail with reference to the attached drawings.

Figure 1:
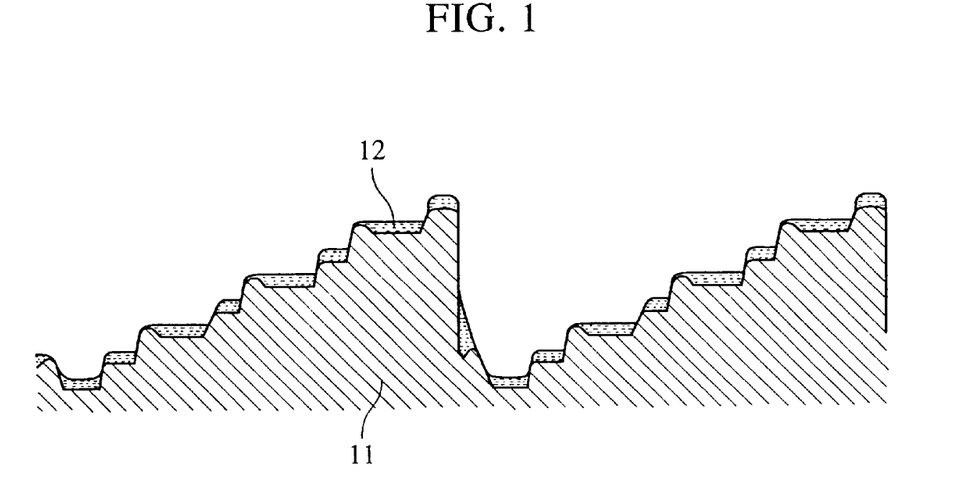
FIG. 1 is a cross-sectional view of a binary-type diffractive optical element in accordance with the present invention.

FIG. 1 is a cross-sectional view of a diffractive optical element in accordance with the present invention, in which a binary-type diffractive element is formed on a quartz ($SiO_2$) glass substrate 11. The surface pattern is the same as that in the conventional method shown in FIG. 8, as a result of misalignment of masks. A monolayer thin-film 12 is formed on the surface pattern of the substrate 11. The thin-film 12 is composed of $SiO_2$, that is, the same material as that of the substrate 11.

Figure 2:
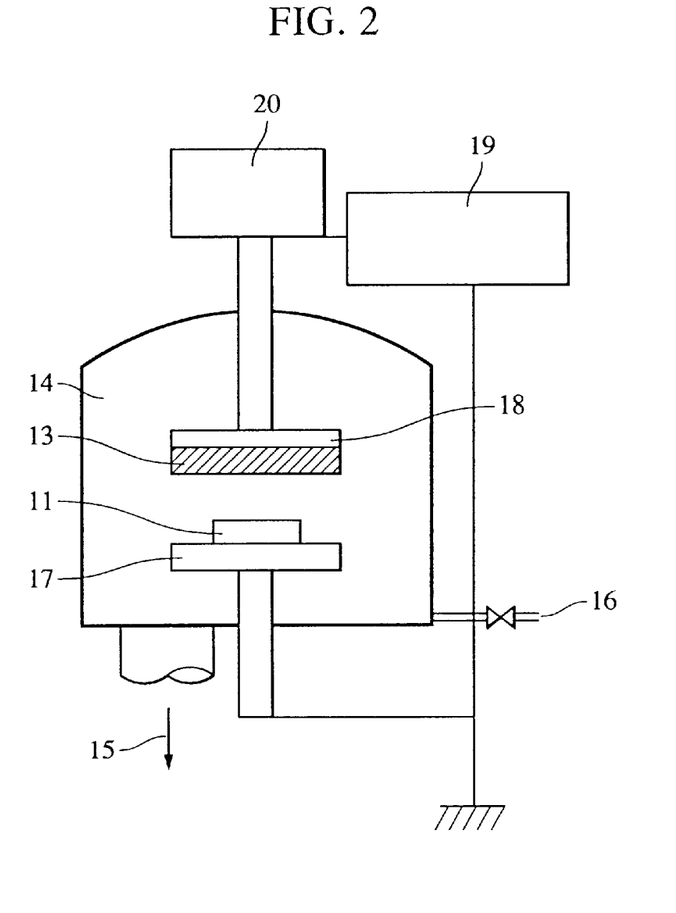
FIG. 2 is a schematic cross-sectional view of a radiofrequency (RF) sputtering system.

FIG. 2 is a schematic cross-sectional view of a radiofrequency (RF) sputtering system used in deposition of $SiO_2$ thin-films. The thin-film 12 in FIG. 1 may be formed using such a sputtering system, a vacuum deposition system, or a plasma-enhanced CVD system. In the RF process, high-energy cations collide with a target 13 so as to sputter atoms or molecules of the constituents of the target 13 from the surface of the target 13. The sputtered atoms or molecules are deposited on the substrate 11 facing the target 13 to form a thin film on the substrate 11.

An evacuation system 15 adjusts the internal pressure of a vacuum chamber 14 and a gas supply system 16 supplies Ar gas to the interior of the vacuum chamber 14. A binary-type diffractive element is formed on the surface of the substrate 11 which faces the $SiO_2$ target in the vacuum chamber 14. The substrate 11 and the target 13 are fixed by holders 17 and 18, respectively. An RF power source 19 is connected to the substrate holder 17 and the target holder 18 via a matching box 20.

Ar gas is introduced through the gas supply system 16 and ionized by discharge. Argon ions collide with the target 13, and the sputtered species from the target 13 are deposited on the substrate 11 to form a film. The matching box 20 effectively supplies energy from the RF power source to the target 13. The evacuation system 15 controls the pressure of the discharged gas to approximately $10^{-1}$ to $10^{-2}$ Pa during the RF sputtering.

The use of the RF sputtering process for the $SiO_2$ target 13 permits deposition of a film having significantly high directional selectivity. Thus, this process selectively deposits the excited species on the horizontal faces of the steps and can suppress deposition of the excited species on the vertical faces of the steps. The deposited film becomes flat as the deposition proceeds. The resulting film 12 has flat surfaces on the steps, regardless of the original fine irregular pattern on the substrate 11.

When the thickness of the film 12 is small, the film surface reflects the irregular pattern on the substrate 11. When the thickness of the film is excessively large, the corners of the steps are rounded. Thus, the optimized film thickness for planarizing the irregular pattern on the substrate is approximately a half to three-quarters the height of a level. For example, the height per step in a binary-type eight-level element formed on the substrate 11 is 61 nm for a wavelength λ of 248 nm and a refractive index n of 1.51, and accordingly, the film thickness is approximately 30 to 45 nm.

Since the film 12 and the substrate 11 are composed of the same material, no reflection will occur at the interface between the formed film 12 and the substrate 11. Thus, the reflection will occur only at the interface between air and the film 12. In addition, a decrease in diffraction efficiency due to production errors can be suppressed. As a result, the diffraction efficiency of this binary-type diffractive element is improved to 86%, which is considerably near to the ideal value of 91%, considering Fresnel reflection at the interface between air and the substrate in the eight-level configuration, and is 7% higher than that in the state prior to the formation of the $SiO_2$ film.

Another embodiment provides an antireflective film in order to suppress Fresnel reflection at the interface between air and the substrate 11. In such an embodiment, the diffraction efficiency of the binary-type eight-level diffractive element is very near to the ideal value of 95%. When an antireflective film is deposited directly on the surface of the substrate 11 having a surface profile shown in FIG. 8, the thickness of the deposited antireflective film varies locally depending on the fine irregular pattern. Thus, the effect of the antireflective film is restricted. In the present invention, the irregular pattern on the surfaces of the steps is planarized and then an antireflective film is formed thereon. As a result, the antireflective film has high reflective efficiency.

Figure 3:
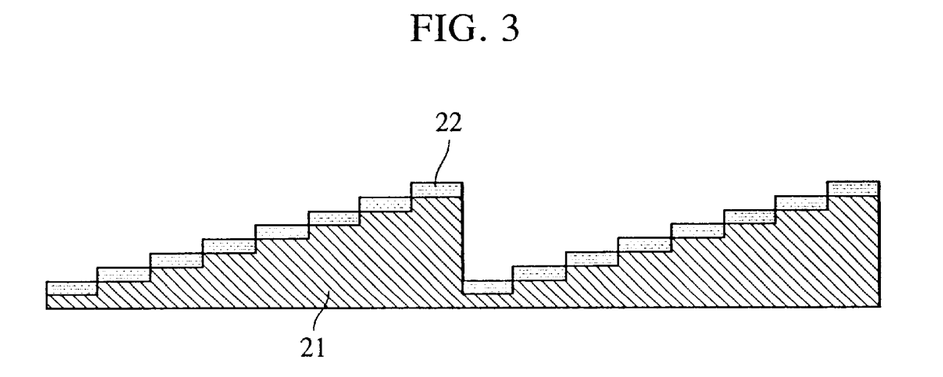
FIG. 3 is a cross-sectional view of a diffractive optical element provided with a monolayer film.

FIG. 3 is a cross-sectional view showing the formation of a monolayer antireflective film. A $MgF_2$ monolayer film 22 is formed on a $SiO_2$ binary-type diffractive element substrate 21 in which the fine irregular pattern is preliminarily planarized. The refractive index n of $MgF_2$ is 1.43. For a wavelength λ of 248 nm, the theoretical diffraction efficiency is improved from 91% to 95% at a film thickness d of 43.4 nm (derived from n·d=λ/4) due to reduced reflection.

Figure 4:
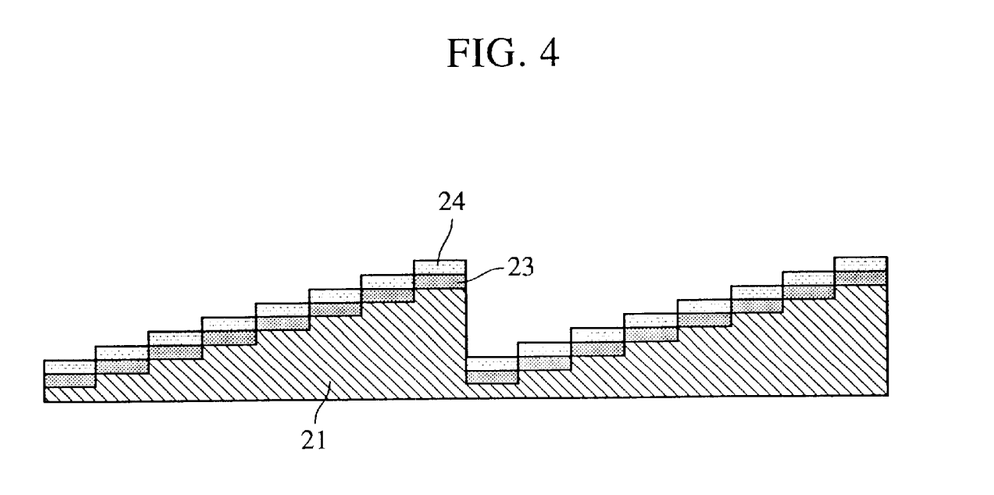
FIG. 4 is a cross-sectional view of a diffractive optical element provided with a composite film.
Figure 5:
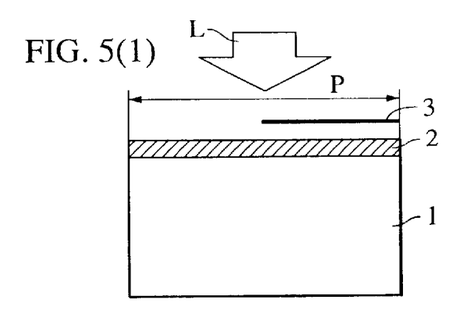

FIG. 4 is a cross-sectional view of a double-layer antireflective configuration which is composed of an $Al_2O_3$ film 23 and a $MgF_2$ film 24. The $MgF_2$ film 24 has a thickness d of 43.4 nm. The thickness d' of the $Al_2O_3$ film 23 is determined by the relationship n'·d'=λ/4 wherein n' is the refractive index of the $Al_2O_3$ film. Thus, the thickness d' is 36.0 nm for λ=248 nm and n'=1.72. This double-layer configuration can almost completely suppress reflection at the interface between air and the substrate, and the diffraction efficiency is improved to the theoretical value of 95%.

Although it is difficult to achieve a diffraction efficiency of 95% in an actual binary-type eight-level element, the function of the antireflective film can be enhanced when the antireflective film is formed on an $SiO_2$ underlying film 12 which is formed on the substrate 11.

A method for making a thin film by a spin-on-glass (SOG) process will now be described. A SOG film is applied to a binary-type optical device having surface irregularities as shown in FIG. 8 using a spinner rotating at 8,000 rpm. The SOG film is baked at 80° C. for 20 minutes and then at 250° C. for 20 minutes. As a result, a monolayer film similar to the film 12 shown in FIG. 1 is formed on the binary-type optical element. The formed SOG film improves the diffraction efficiency.

Although a transmissive element has been described above, the present invention is also applicable to a reflective binary-type element. In such a case, the film formed for correcting the surface profile may have a refractive index which is different from the refractive index of the substrate. The film may be a monolayer film or a multilayer film.

Figure 9:
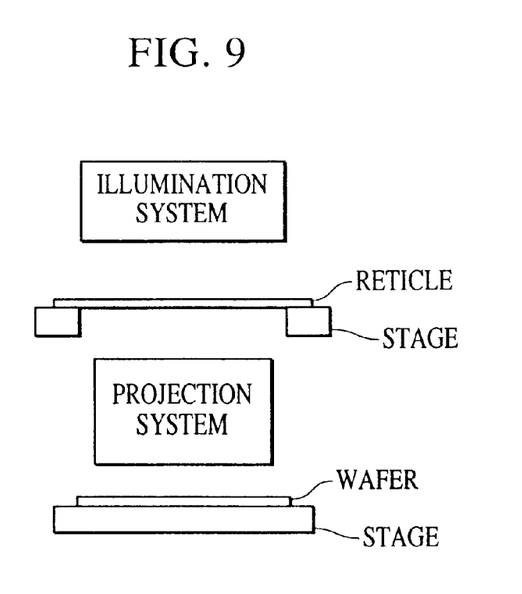
FIG. 9 is a schematic view of a projective exposure system, using a diffractive optical element in accordance with the present invention, as an optical system.
Figure 10A:
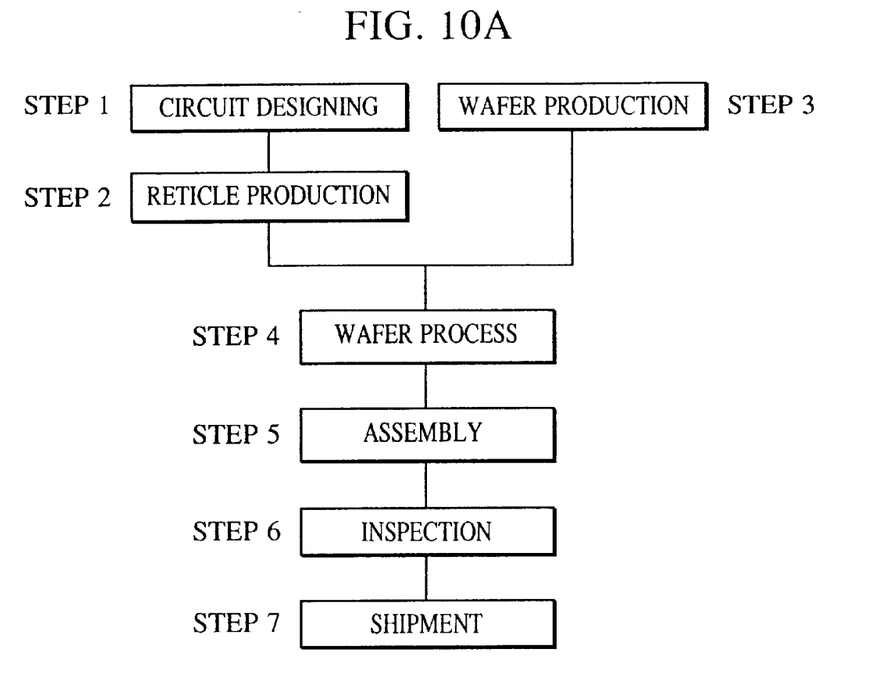
FIGS. 10A and 10B are flow charts of production processes of devices.
Figure 10B:
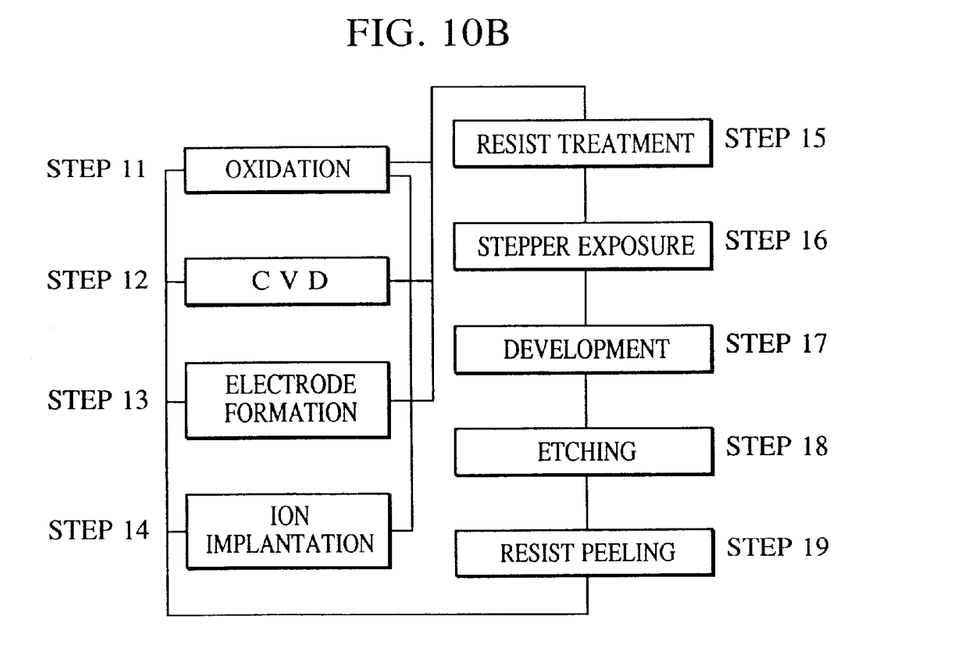

FIG. 9 is a schematic view of a projective exposure system using a diffractive optical element in accordance with the present invention as an optical system. FIGS. 10A and 10B are flowcharts of production processes of devices using the exposure system shown in FIG. 9.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of making an optical element comprising the steps of:

forming on a substrate a multilevel pattern having one or more errors on faces of different levels; and forming on the faces of the different levels a substantially flat light-transmissive film to planarize the faces of the different levels so as to cover the one or more errors, wherein the one or more errors include at least one of depressions and protrusions formed on the faces of the different levels.

2. A method of making an optical element comprising the steps of:

forming on a substrate a multilevel pattern by a lithographic process having one or more errors on the faces of the different levels; and forming a film having a refractive index which is the same as that of the multilevel pattern on the faces of all levels of the multilevel pattern to planarize the faces of all of the levels so as to cover the errors, wherein the errors include at least one of depressions and protrusions formed on the faces of the different levels.

3. A method for making an optical element comprising the steps of:

repeating a plurality of times of series of steps including a step of applying a resist to a substrate, a pattern transfer step, an etching step and a resist removal step to form a multilevel element pattern on the substrate which includes one or more errors on the faces of the different levels; and forming a film having a refractive index which is the same as that of the multilevel element pattern on the faces of all levels of the multilevel pattern to planarize the faces of all of the levels so as to cover the errors, wherein the errors include at least one of depressions and protrusions formed on the faces of the different levels.

4. A method for making an optical element according to claim 2, wherein the lithographic process comprises one of an etching process and a deposition process.

5. A method for making an optical element according to claim 1, further comprising the step of forming at least one antireflective film having a different refractive index from that of the substrate.

6. A binary-type diffractive optical element comprising:

a multilevel pattern, formed on a substrate, having one or more errors on faces of different levels; and a substantially flat light-transmissive film, formed on the faces of the different levels, to planarize the faces of the different levels so as to cover the one or more errors;

wherein the one or more errors include at least one of depressions and protrusions formed on the faces of the different levels.

7. A binary-type diffractive optical element according to claim 6, wherein the film has a thickness that is one-half to three-quarters the height of a level in a diffraction grating constituting the binary-type diffractive optical element.

8. A binary-type diffractive optical element according to claim 6, further comprising at least one antireflective film having a different refractive index from that of the substrate.

9. A binary-type diffractive optical element according to claim 8, wherein the film has a thickness that is one-half to three-quarters the height of a level in a diffraction grating constituting the binary-type diffractive optical element.

10. A binary-type diffractive optical element comprising:

a multilevel pattern formed on a substrate by a lithographic process, the multilevel pattern having one or more errors on faces of different levels; and a film, having a refractive index the same as that of the multilevel pattern formed on the faces of all levels of the multilevel pattern, to planarize the faces of all levels so as to cover the errors;

wherein the errors include at least one of depressions and protrusions formed on the faces of the different levels.

11. A binary-type diffractive optical element according to claim 10, wherein the film has a thickness that is one-half to three-quarters the height of a level in a diffraction grating constituting the binary-type diffractive optical element.

12. A binary-type diffractive optical element according to claim 10, wherein the lithographic process comprises one of an etching process and a deposition process.

13. A binary-type diffractive optical element according to claim 12, wherein the film has a thickness that is one-half to three-quarters the height of a level in a diffraction grating constituting the binary-type diffractive optical element.

14. A binary-type diffractive optical element comprising:

a multilevel element pattern formed on a substrate by repeating a plurality of times a series of steps including the step of applying a resist to a substrate, a pattern transfer step, an etching step, and a resist removal step, the multilevel element pattern including one or more errors on faces of the different levels; and a film, having a refractive index that is the same as that of the multilevel element pattern formed on the faces of all levels of the multilevel pattern, to planarize the faces of all levels so as to cover the errors, wherein the errors include at least one of depressions and protrusions formed on the faces of the different levels.

15. A binary-type diffractive optical element according to claim 14, wherein the film has a thickness which is one-half to three-quarters the height of a level in a diffraction grating constituting the binary-type diffractive optical element.

16. A method according to claim 1, wherein the refractive index of the film is the same as that of the multilevel pattern.

17. A binary-type diffractive optical element according to claim 6, wherein the refractive index of the film is the same as that of the multilevel pattern.

* * * * *

UNITED STATES PATENT AND TRADEMARK OFFICE
CERTIFICATE OF CORRECTION

PATENT NO. : 6,641,985 B2
DATED : November 4, 2003
INVENTOR(S) : Yasuyuki Unno et al.

It is certified that error appears in the above-identified patent and that said Letters Patent is hereby corrected as shown below:

Column 2,
Line 3, "of p/4." should read -- of P/4. --; and
Line 5, "substrate" should read -- substrate is --.

Column 5,
Lines 42, 44 and 46, "A1$_2$O$_3$" should read -- Al$_2$O$_3$ --.

Column 6,
Line 45, "of series" should read -- a series --.

Signed and Sealed this

Sixth Day of July, 2004

JON W. DUDAS
*Acting Director of the United States Patent and Trademark Office*